United States Patent
Taylor et al.

(10) Patent No.: US 6,552,570 B2
(45) Date of Patent: Apr. 22, 2003

(54) INPUT CIRCUIT WITH NON-DELAYED TIME BLANKING

(75) Inventors: Gregory F. Taylor, Portland, OR (US); Chi-Yeu Chao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/894,187

(22) Filed: Jun. 27, 2001

(65) Prior Publication Data

US 2003/0001617 A1 Jan. 2, 2003

(51) Int. Cl.[7] .............................................. H03K 3/356
(52) U.S. Cl. ............................ 326/82; 326/93; 327/217
(58) Field of Search ............................. 326/46, 93, 82; 327/217, 299

(56) References Cited

U.S. PATENT DOCUMENTS

| | | |
|---|---|---|
| 5,319,678 A | 6/1994 | Ho et al. |
| 5,502,409 A * | 3/1996 | Schnizlein et al. ............ 327/99 |
| 5,539,337 A | 7/1996 | Taylor et al. |
| 6,218,879 B1 | 4/2001 | Kilpatrick |

OTHER PUBLICATIONS

M.S. Ghausi, Electronic Devices and Circuits, 1985, pp. 638 and 639, CBS College Publishing, New York.

* cited by examiner

*Primary Examiner*—Daniel Chang
(74) *Attorney, Agent, or Firm*—Blakely, Sokoloff, Taylor & Zafman LLP

(57) ABSTRACT

An input circuit that receives an input signal and generates an output signal as a function of the input signal includes a latching circuit and a time blanking circuit. The latching circuit detects a transition of the input signal and causes a corresponding transition of the output signal. The time blanking circuit prevents the output signal from transitioning again for a predetermined period. This period begins with essentially no delay from the transition of the output signal, which can reduce the input circuit's sensitivity to high frequency noise that may be present on transitions of the input signal.

30 Claims, 8 Drawing Sheets

INPUT CIRCUIT WITH NON-DELAYED TIME BLANKING

TECHNICAL FIELD

This disclosure relates generally to integrated circuits, and in particular but not exclusively, relates to input circuits.

BACKGROUND

A typical integrated circuit includes input circuits to receive signals from other parts of the integrated circuit and output them with "restored" voltage levels and appropriate driving current for circuitry receiving the output signal of the input circuit. As is well known, a variety of sources may inject noise into the signal received by the input circuit. For example, sources include ringing caused by mismatched output drivers or interconnect impedance, signal cross-coupling, and power supply noise. This noise can cause an input circuit to improperly output the received signal.

One conventional solution to this noise problem is to design the input circuits with hysteresis (e.g., having a trip point for low-to-high transition that is higher than the trip point for a high-to-low transition of the input signal). However, this solution is ineffective against noise that causes the signal to exceed one of the trip points.

BRIEF DESCRIPTION OF THE DRAWINGS

Non-limiting and non-exhaustive embodiments of the present invention are described with reference to the following Figures, wherein like reference numerals refer to like parts throughout the various views unless otherwise specified.

DETAILED DESCRIPTION OF THE ILLUSTRATED EMBODIMENTS

Embodiments of a circuit and method for receiving an input signal and generating a corresponding output signal are described herein. In the following description, numerous specific details are set forth (such as, for example, the components/functional units of a microprocessor) to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In one aspect of the present invention, an input circuit includes a latching circuit and a time blanking circuit. The input circuit receives an input signal and generates an output signal as a function of the input signal. In particular, the latching circuit detects a transition of the input signal and causes a corresponding transition of the output signal. Further, in accordance with this aspect of the invention, the time blanking circuit prevents the output signal from transitioning again for a predetermined period. This period begins with essentially no delay from the transition of the output signal. This aspect advantageously reduces the input circuit's sensitivity to high frequency noise that may be present on transitions of the input signal.

The present invention is described below in the context of a clock input circuit of a microprocessor; however, in light of the present disclosure, those of ordinary skill in the art will understand that the methods and apparatus of the present invention are generally applicable to input circuits for signals other than clock signals and to IC devices other than microprocessors.

Figure 1:
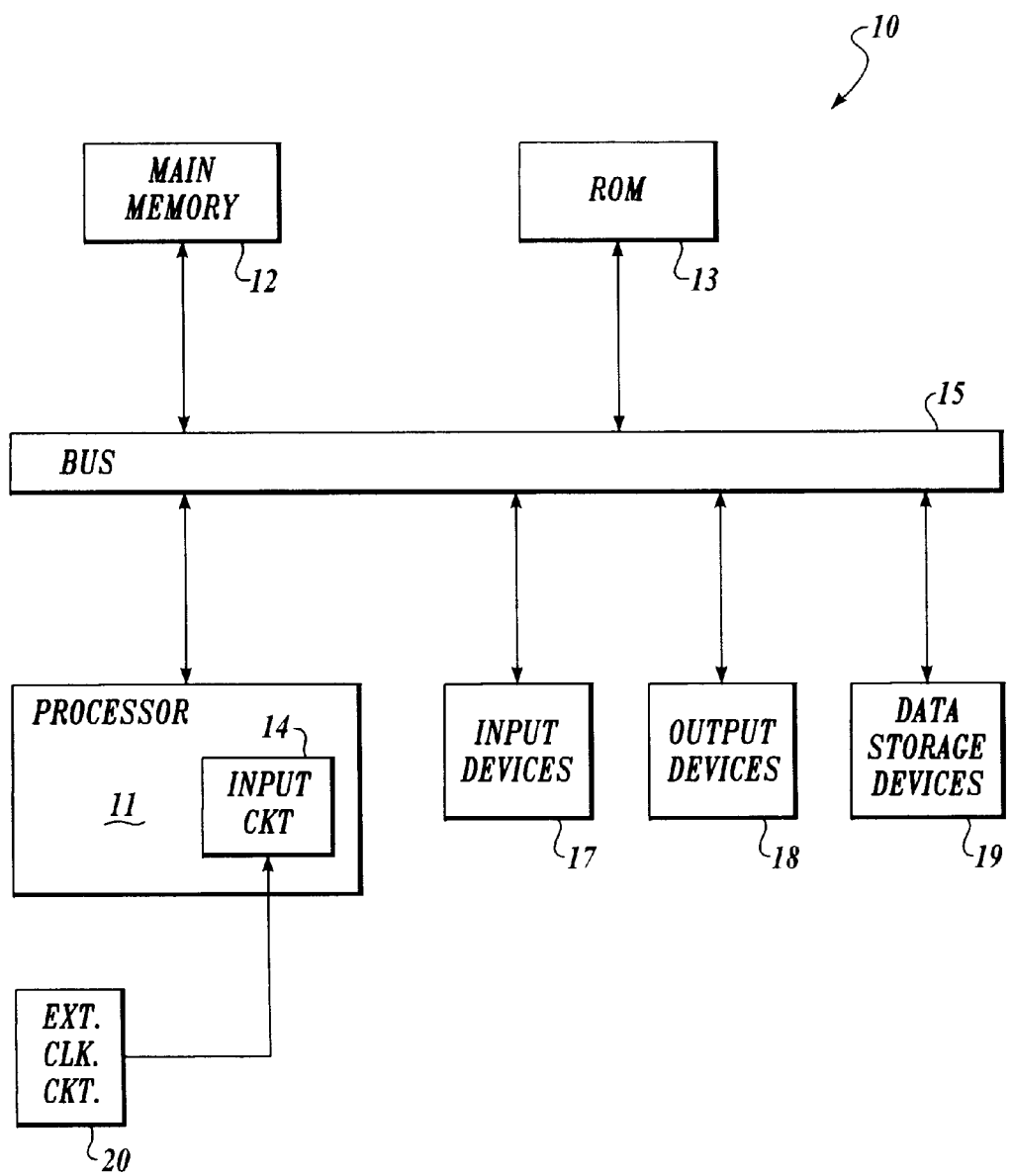
FIG. 1 is a block diagram illustrating a computer system incorporating an input circuit according to one embodiment of the present invention.

Shown schematically in FIG. 1 is a computer system 10 incorporating a processor 11 with an input circuit 14 according to the present invention. This embodiment of computer system 10 also includes a main memory 12, a read only memory (ROM) 13, a bus 15, one or more input devices 17, one or more output devices 18 and one or more data storage devices 19. In this exemplary embodiment, input circuit 14 is connected to receive a clock signal from an external clock circuit 20. In accordance with the present invention, processor 11 can have a large number of input circuits identical to input circuit 14 connected to receive other signals from other circuits. Various embodiments of input circuit 14 are described below in conjunction with FIGS. 3–9.

Processor 11 is coupled via a bus 15 to main memory 12, which may comprise one or more dynamic random access memory (DRAM) devices for storing information and instructions to be executed by processor 11. Main memory 12 may also be used for storing temporary variables or other intermediate information during execution of instructions by processor 11. ROM 13, for storing static information and instructions for processor 11, is coupled to processor 11 via bus 15.

Input devices 17, such as a keyboard or mouse, are coupled to processor 11 through bus 15. Output devices 18 are also coupled to processor 11 via bus 15. Typical output devices 18 include printers and display monitors. Storage devices 19 are also coupled to processor 11 via bus 15.

Common data storage devices include hard disk drives, floppy disk drives, and CD ROM drives. In light of this disclosure, those of ordinary skill in the art will understand that computer system 10 may include other components and subsystems in addition to those shown and described with respect to FIG. 1. By way of example, computer system 10 may include video memory, cache memory, as well as other dedicated memory, and additional signal lines and busses.

Figure 2:
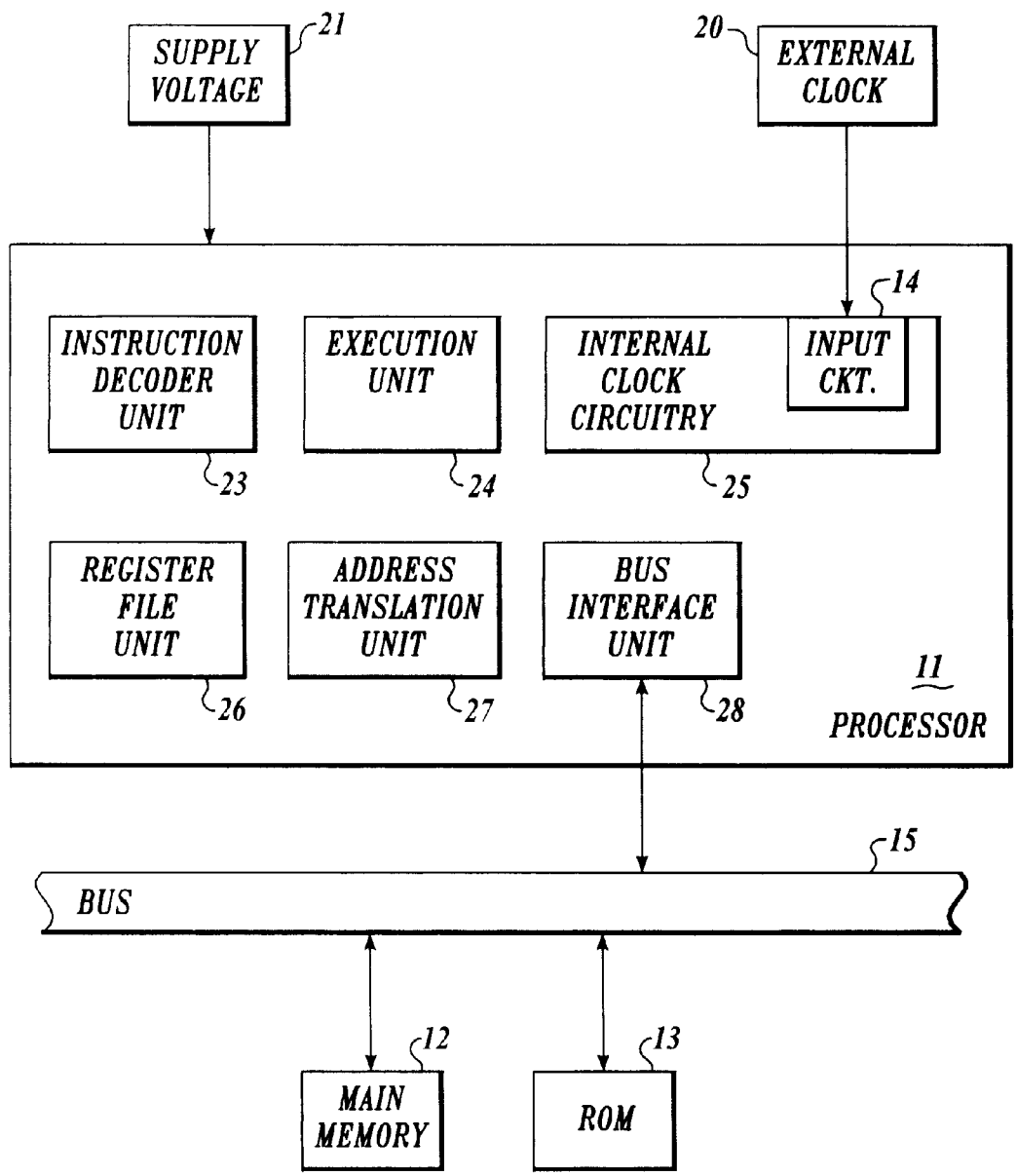
FIG. 2 is a block diagram illustrating the processor of FIG. 1, according to one embodiment of the present invention.

FIG. 2 illustrates an embodiment of processor 11 (FIG. 1), which is coupled to external clock source 20 and a supply voltage source 21. This embodiment of processor 11 includes an instruction decoder unit 23, an execution unit 24, internal clock circuitry 25, register file unit 26, address translation unit 27 and bus interface unit 28. In this embodiment, input circuit 14 is part of internal clock circuitry 25. In one embodiment, supply voltage source 21 and external clock source 20 respectively provide a supply voltage VCC and a system clock SCLK to processor 11.

The embodiment of processor 11 presented in FIG. 2 is illustrative. In light of this disclosure, those of ordinary skill in the art will understand that, in practice, a modern processor is generally more complex and may include additional components, such as internal cache, which have been omitted for ease of understanding. To improve clarity, FIG. 2 does not show internal buses and other communication paths that electrically interconnect internal clock circuitry 25 and various functional units of processor 11 (e.g., instruction decode unit 23, execution unit 24, register file unit 26, address translation unit 27, and bus interface unit 28). In addition, FIG. 2 does not show other input circuits substantially similar to input circuit 14 that may be used to receive other signals. Accordingly, processor 11 is presented without limitation, and the present invention is generally applicable to all types of processors (e.g., microprocessors, microcontrollers, digital signal processors, etc.), irrespective of the specific architecture employed.

The bus interface unit 28 is coupled to bus 15, as well as main memory 12 and ROM 13. Bus interface unit 28 facilitates transmission of data between main memory 12 and processor 11, and performs fetching of instructions and other data from ROM 13. Address translation unit 27 performs memory management for processor 11. Specifically, address translation unit stores the memory addresses—whether in main memory 12, internal cache, or other memory—of data being used by the processor 11 during operation. Instruction decoder unit 23 decodes instructions and other control signals received by processor 11.

Execution unit 24 is intended to present a broad category of microprocessor functional units providing a wide range of functions. By way of example, execution unit 24 may comprise an arithmetic and logic unit for performing arithmetic operations, including shifts, addition, subtraction, multiplication, and division. Register file unit 26 may comprise one or more types of registers for storing data being used by processor 11. For example, register file unit 26 may include integer registers, status registers, instruction pointer registers, and floating point registers, as well as others. If present, the internal cache (not shown) may be used, for example, to store data and control signals from main memory 12.

External clock source 20 provides a clock signal having an external clock frequency to internal clock circuitry 25 via input circuit 14 (described in more detail below). Internal clock circuitry 25, which may comprise a phase lock loop (PLL) circuit, adjusts the external clock frequency—either increasing or decreasing this frequency—to achieve a desired operating frequency for processor 11.

Figure 3:
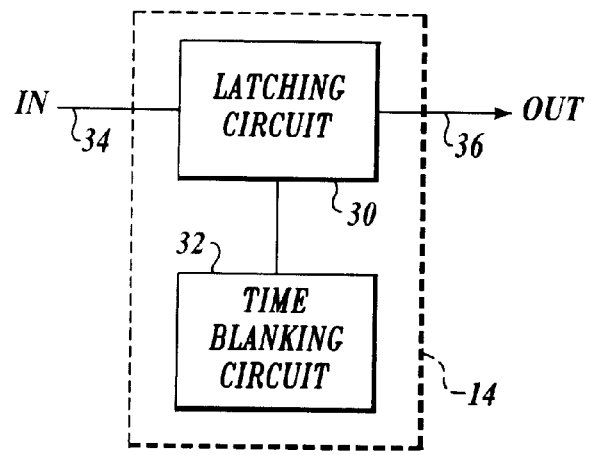
FIG. 3 is a block diagram illustrating an input circuit according to one embodiment of the present invention.

FIG. 3 illustrates input circuit 14 (FIG. 2), according to one embodiment of the present invention. In this embodiment, input circuit 14 includes a latching circuit 30 and a time blanking circuit 32 coupled to latching circuit 30.

Figure 4:
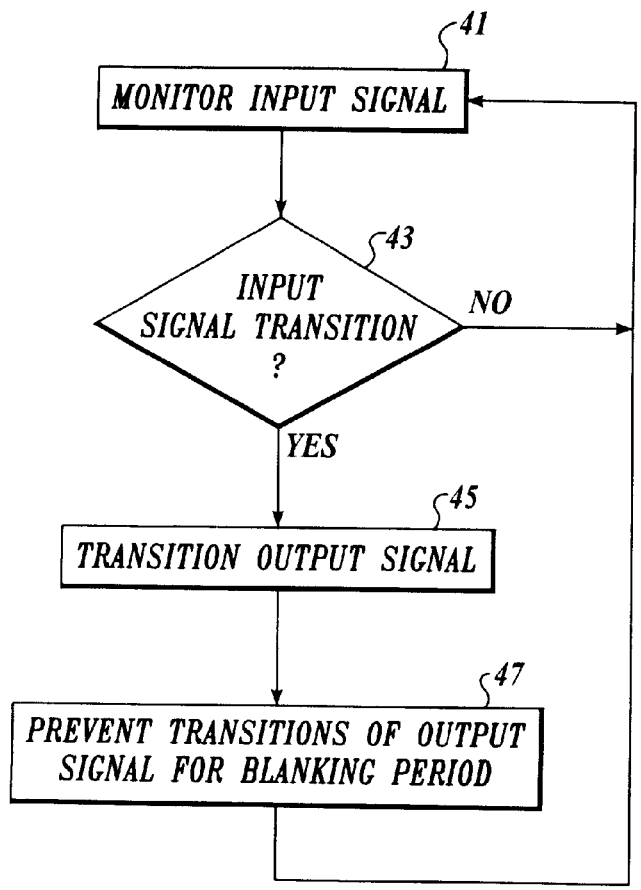
FIG. 4 is a flow diagram illustrating the operation of the input circuit depicted in FIG. 3, according to one embodiment of the present invention.

Referring to both FIG. 3 and the flow diagram of FIG. 4, input circuit 14 operates as follows. Input circuit 14 receives an input signal IN via a line 34 and generates an output signal OUT as a function of the input signal via a line 36. In particular, latching circuit 30 is connected to line 34 to receive input signal IN. Latching circuit 30, in effect, monitors input signal IN for a transition of its logic level (e.g., a low-to-high or a high-to-low logic level transition). This operational is illustrated as steps 41 and 43 in FIG. 4. Latching circuit 30 continues to monitor input signal IN without changing the logic level of output signal OUT while the logic level of input signal IN is unchanged. This operation is illustrated in FIG. 4 by the looping back to step 41 from step 43 if no transition is detected in step 43.

If input signal IN transitions to a different logic level, latching circuit 30 causes a corresponding transition of output signal OUT at line 36. This operation is illustrated as a step 45 in FIG. 4. For example, in one embodiment latching circuit 30 generates output signal OUT with the opposite logic level as input signal IN. In other embodiments, latching circuit 30 can generate output signal OUT with the same logic level as input signal IN.

In response to the transition of output signal OUT, time blanking circuit 32, in conjunction with latching circuit 30, prevents output signal OUT from transitioning again for a predetermined period. In accordance with the present invention, this predetermined period begins with essentially no delay from the transition of output signal OUT. This operation is illustrated as a step 47 in FIG. 4. This aspect advantageously reduces the sensitivity of input circuit 14 to high frequency noise that may be present on transitions of input signal IN. At the end of the predetermined period, input circuit 14 is free to transition output signal OUT in response to the logic level of input signal IN. This operation is illustrated in FIG. 4 by the looping back to step 41 from step 47.

Figure 5:
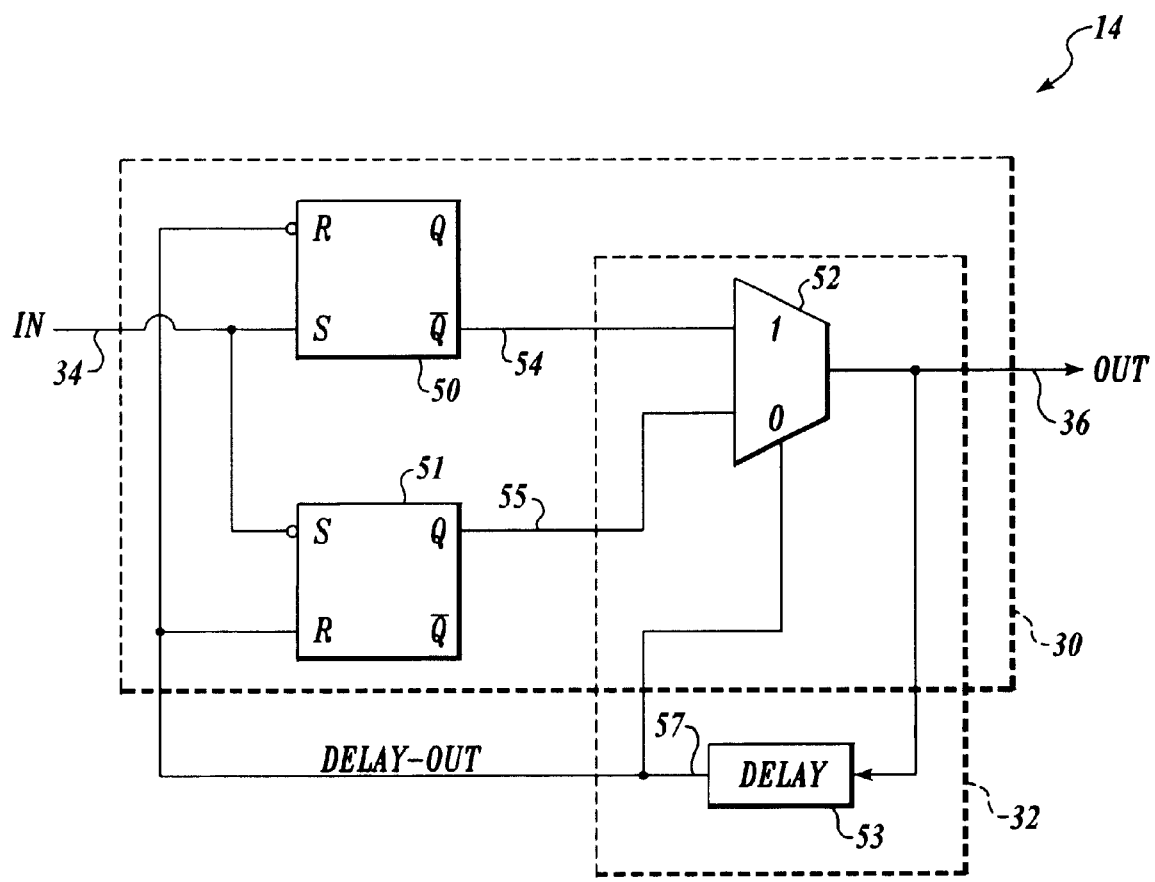
FIG. 5 is a schematic diagram illustrating an implementation of the input circuit depicted in FIG. 3, according to one embodiment of the present invention.

FIG. 5 illustrates an implementation of input circuit 14 (FIG. 3), according to one embodiment of the present invention. This embodiment includes RS latches 50 and 51, a two-input multiplexer 52 and a delay circuit 53. In this embodiment, RS latches 50 and 51, in conjunction with multiplexer 53 serve as latching circuit 30 (FIG. 3). Further, delay circuit 53 in conjunction with multiplexer 52 serve as time blanking circuit 32 (FIG. 3). Delay circuit 53 is used in defining the time blanking period that begins with each transition of output signal OUT, as described below.

The elements of this embodiment of input circuit 14 are interconnected as follows. RS latch 50 is connected to receive input signal IN at its S terminal via line 34. The inverted output terminal of RS latch 50 is connected to one of the input terminals of multiplexer 52 via a line 54. RS latch 51 has a complemented S terminal that is connected to receive the input signal IN. The non-inverted output terminal of RS latch 51 is connected to the other input terminal of multiplexer 52 via a line 55. The output terminal of multiplexer 52 is connected to output line 36 and to the input lead of delay circuit 53. Delay circuit 53 has an output lead 57 connected to the control terminal of multiplexer 52, a complemented R terminal of RS latch 50 and to the R terminal of RS latch 51. The operation of the embodiment of input circuit 14 is described below in conjunction with FIG. 6.

Although FIG. 5 illustrates a particular implementation of input circuit 14, in this embodiment of the present invention, the RS latches are configured so that when one RS latch receives signals at its R and S terminals that cause the RS latch to perform a "set" operation, the other RS latch receives these same signals but performs a "reset" operation. For example, in this embodiment, one RS latch receives input signal IN at its S terminal, while the other RS latch receives, in effect, the complement of input signal IN at its S terminal. Similarly, one RS latch receives output signal OUT (via delay circuit 53) at its S terminal, while the other RS latch in effect receives the complement of output signal OUT at its R terminal.

In addition, the inverted output terminal of one RS latch (i.e., Qbar) and the non-inverted output terminal (i.e., Q) of the other RS latch are used by input circuit 14 so that, in effect, both RS latches generate the same output signal in response to the same input signals. For example, when the RS latch with the non-inverted output signal performs a set operation (i.e., Q=1), the other RS latch performs a reset operation (Q=0), but input circuit 14 uses the inverted output signal.

Still further, according to this embodiment of the present invention, in the steady state, the RS latches are configured so that one RS latch, in effect, will be in the "unchanged" state (R=S=0) and the other RS latch, in effect will be in the "don't care" state (R=S=1). In the steady state, multiplexer 52 is configured to select the output signal from the RS latch in the "unchanged" state. As a result of this configuration, a transition occurring in input signal IN causes the selected RS latch to perform a set operation and the other RS latch to perform a reset operation (but providing an equivalent output signal because its output signal is inverted relative to the other RS latch). In addition, this transition also starts the time blanking period. Thus, a glitch on input signal IN during the time blanking period can only cause the selected RS latch to enter the unchanged state, thereby leaving the selected output signal unchanged.

At the end of the time blanking period, multiplexer 52 receives a signal that causes multiplexer 52 to transition it logic level, which causes multiplexer 52 to select the output signal from the other RS latch (i.e., the reset RS latch). In this embodiment, this signal is signal DELAY_OUT, which is a delayed version of output signal OUT provided by delay circuit 53. This signal (or, in effect, its complement) is also provided to both RS latches at their R terminals. Thus, the transition of the signal causes the RS latch in the set state to transition to the "don't care" state and the RS latch in the reset state to transition to the unchanged state. Accordingly, in the steady state, the selected RS latch in the unchanged state and ready to enter the set state in response to the next transition of input signal IN. This operation is described below in conjunction with FIG. 6.

Figure 6:
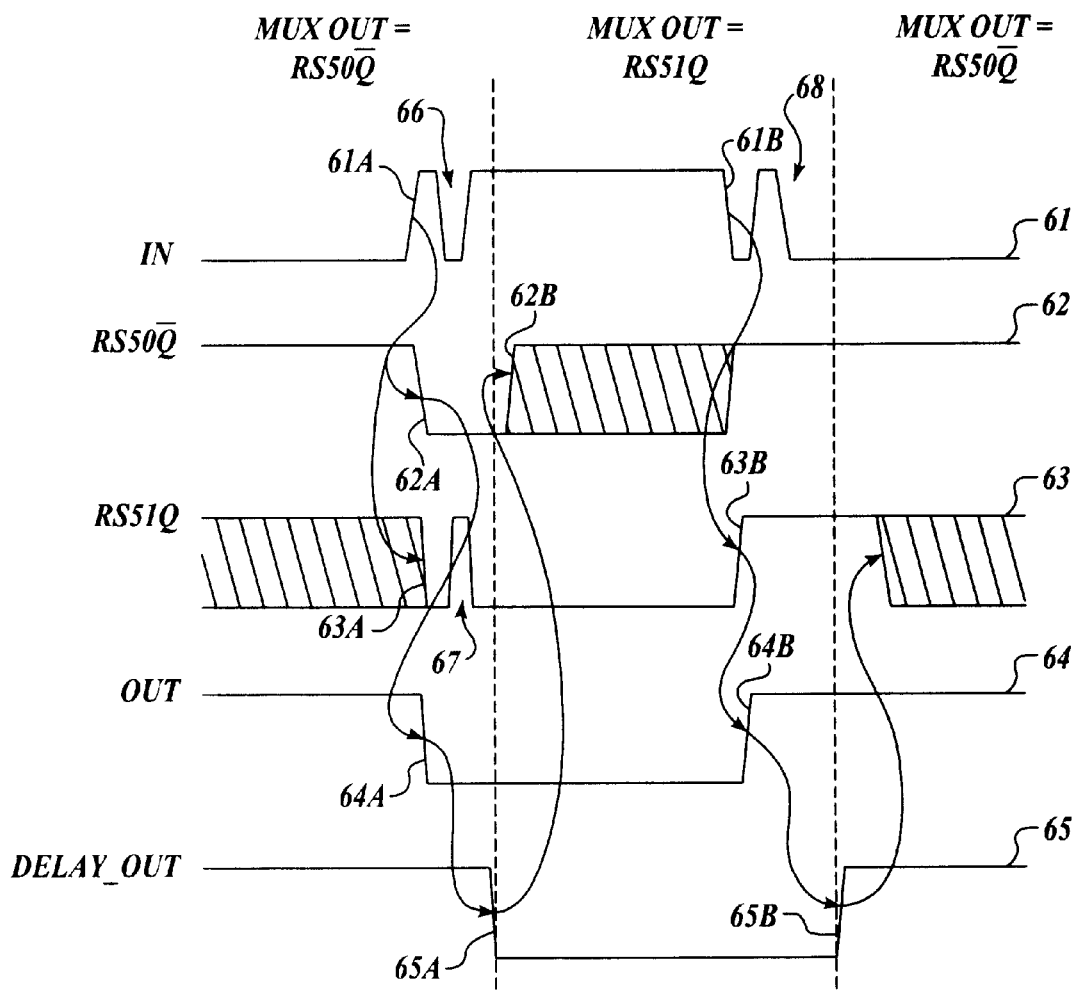
FIG. 6 is a timing diagram illustrating the operation of input circuit depicted in FIG. 5.

FIG. 6 illustrates the timing of input circuit 14 (FIG. 5) in operation during a low-to-high transition of input signal IN and then returning to a logic low level. In particular, a waveform 61 illustrates input signal IN. A waveform 62 illustrates the inverted output signal from RS latch 50. A waveform 63 illustrates the non-inverted output signal from RS latch 51. A waveform 64 illustrates output signal OUT, and a waveform 65 illustrates the output signal from delay circuit 53.

Referring to FIGS. 5 and 6, this embodiment of input circuit 14 operates as follows. This description starts with input circuit 14 being in an initial state with: (a) input signal IN at a logic low level; (b) the inverted output signal of RS latch 50 at a logic high level; (c) the non-inverted output signal from RS latch 51 at a logic high level; (d) output signal OUT at a logic high level; and (e) the output signal of delay circuit 53 (i.e., signal DELAY_OUT) at a logic high level. As a result, RS latch 50, in effect, receives logic low levels at its R and S terminals, which put RS latch 50 in the unchanged state, outputting a logic high level signal. The logic high level of signal $DELAY_{13}$ OUT causes multiplexer 52 to select the inverted output signal of RS latch 50 to serve as output signal OUT. RS latch 51, in effect, receives logic high levels at its R terminal and its S terminal (i.e., the don't care state), but its output signal is not selected by multiplexer 52.

When input signal IN transitions to a logic high level as indicated by an edge 61A of waveform 61, RS latch 50, in effect, receives a logic low reset signal and a logic high set signal, thereby causing its inverted output signal to transition to a logic low level, as indicated by edge 62A. In addition, RS latch 51, in effect, receives a logic high reset signal and a logic low set signal, thereby causing its non-inverted output signal to transition to a logic low level as indicated by an edge 63A of waveform 63. Because multiplexer 52 selects the inverted output signal of RS latch 50, edge 62A also results in output signal OUT transitioning to a logic low level, as indicated by an edge 64A of waveform 64.

In this example, input signal IN experiences noise relatively quickly after edge 61A. This noise causes a falling edge quickly followed by a rising edge in waveform 61, as indicated by an arrow 66. This noise occurs within the time blanking period defined by delay circuit 53 (i.e., the period starting from the transition of the output signal of RS latch 50 to when the transition propagates through delay circuit 53). Because the R terminal of RS latch 50, in effect, receives a logic low level (because the logic low level of output signal OUT is delayed be delay circuit 53), the noise on input signal IN puts RS latch 50 in the "unchanged" state (i.e., R=S=0), resulting in no change in output signal OUT. On the other hand, the noise on input signal IN can cause transitions in the output signal of RS latch 51. However, because multiplexer 52 selects the inverted output signal from RS latch 50 during the time blanking period, such transitions do not affect output signal OUT.

At the end of the time blanking period (i.e., the delay provided by delay circuit 53), signal DELAY_OUT transitions to a logic low level, as indicated by an edge 65A of waveform 65. Consequently, multiplexer 52 selects the non-inverted output signal of RS latch 51. In addition, the logic low level of signal DELAY_OUT propagates to the complemented R terminal of RS latch 50 (and the R terminal of RS latch 51), which, in effect, causes RS latch 50 to receive a logic high reset signal. In this embodiment, RS latch 50 causes its inverted output signal to transition to a logic high level, as indicated by an edge 62B of waveform 62. However, this transition does not affect output signal OUT because multiplexer 52 has selected the non-inverted output signal of the RS latch 51. RS latch 50 is in a "don't care" state because it receives, in effect, logic high R and S signals (which is not allowed in typical uses of RS latches), which is tolerated because multiplexer 52 has selected the output signal of RS latch 51.

In the steady state after the time blanking period, RS latch 51, in effect, receives logic low level signals at its R and S terminals. Thus, RS latch 51 is in the unchanged state, outputting a logic low level signal that is selected by multiplexer 52 to serve as output signal OUT. When input signal IN transitions to a logic low level signal, as indicated by an edge 61B of waveform 61, RS latch 51 receives a logic high level signal at its S terminal, thereby causing RS latch 51 to transition its non-inverted output signal to a logic high level. Multiplexer 52 propagates this transition as output signal OUT, as indicated by an edge 64B of waveform 64.

During the time blanking period initiated by the low-to-high transition of output signal OUT, multiplexer 52 continues to select the non-inverted output signal of RS latch 51. Thus, noise (e.g., indicated by an arrow 68) causing a transition of input signal IN during the time blanking period merely cause RS latch 51 to enter the unchanged state. Thus, such noise occurring during the time blanking period does not affect output signal OUT.

In addition, the high-to-low transition of input signal IN (e.g., edge 61B) results in RS latch 50 receiving in effect a logic low level signal at its S terminal. Consequently, RS latch 50 enters the "reset" state. Thus, the inverted output signal of RS latch 50 remains at a logic high level. As a result, in this embodiment, noise occurring during the time banking period does not affect the inverted output signal of RS latch 50.

At the end of the time blanking period, signal DELAY_OUT transitions to a logic high level, as indicated by an edge 65B of waveform 65. This transition causes multiplexer 52 to select the inverted output signal from RS latch 50, which is outputting a logic high level. Thus, the logic level of output signal OUT is unchanged and RS latches 50 and 51 respectively receive, in effect, a logic low and a logic high signal at their R terminals. Thus, input circuit 14 is back in the initial state described above.

Figure 7:
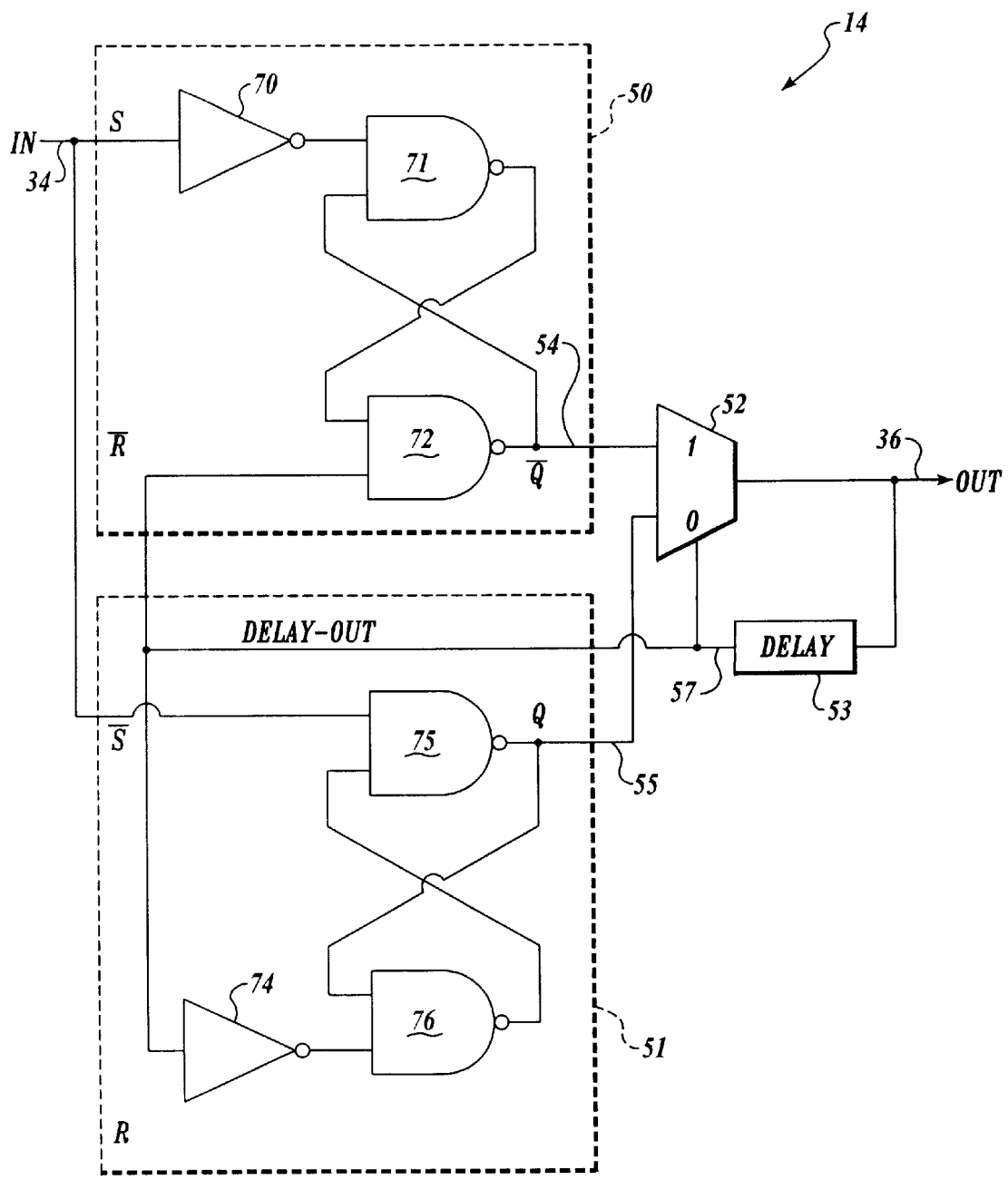
FIG. 7 is a schematic diagram illustrating implementations of the RS latches depicted in FIG. 5, according to one embodiment of the present invention.

FIG. 7 schematically illustrates an implementation of RS latches 50 and 51 (FIG. 5), according to one embodiment of the present invention. In this embodiment, RS latch 50 includes an inverter 70 and two-input NAND gates 71 and 72. Inverter 70 is connected to receive input signal IN via line 34, which serves as the S terminal for RS latch 50. NAND gates 71 and 72 are cross-coupled (i.e., each NAND gate having its output lead connected to one of the input leads of the other NAND gate). NAND gate 71 has its other input lead connected to the output lead of inverter 70. The other input lead of NAND gate 72 is connected to the output lead of delay circuit 53 via line 57, which serves as the complemented R terminal for RS latch 50. The output lead of NAND gate 72 serves as the inverted output terminal of RS latch 50. Such an implementation is similar to a standard RS latch implementation having two inverters and two NAND gates (see e.g., "Electronic Devices and Circuits: Discrete and Integrated", M. S. Ghausi, 1985, pages 638–639) except that the inverter corresponding to the complemented R input terminal of RS latch 50 is omitted to achieve the complementing. Of course, in other embodiments, the standard NAND gate implementation of the RS latch with an additional inverter connected to the R input terminal. In light of the present disclosure, those skilled in the art can implement RS latch circuits suitable for use in input circuit 14, without undue experimentation.

Similarly, RS latch 51 includes an inverter 74 and two-input NAND gates 75 and 76. Inverter 74 is connected to receive signal DELAY_OUT from delay circuit 53 via line 57. The input lead of inverter 74 serves as the R terminal for RS latch 51. NAND gates 75 and 76 are cross-coupled. NAND gate 76 has its other input lead connected to the output lead of inverter 74. NAND gate 75 has its other input lead connected to receive input signal IN via line 34, which serves as the complemented S terminal of RS latch 51. The output lead of NAND gate 75 serves as the non-inverting output terminal of RS latch 51. Such an implementation is also similar to a standard RS latch implementation having two inverters and two NAND gates, except that the inverter corresponding to the complemented S input terminal of RS latch 51 is omitted to achieve the complementing.

Multiplexer 52 can be implemented in any suitable manner (e.g., using transmission gates). Delay circuit 53 can also be implemented in any suitable manner (e.g., an even number of cascaded inverters). In one embodiment, delay circuit provides a delay of about five nanoseconds so that a transition of input signal IN, in effect, is sampled only once. In other embodiments, the delay can different but should be at least as long as the rise/fall time of the input signal, and can be as long as the shorter of the input signal's logic high or logic low time.

Figure 8:
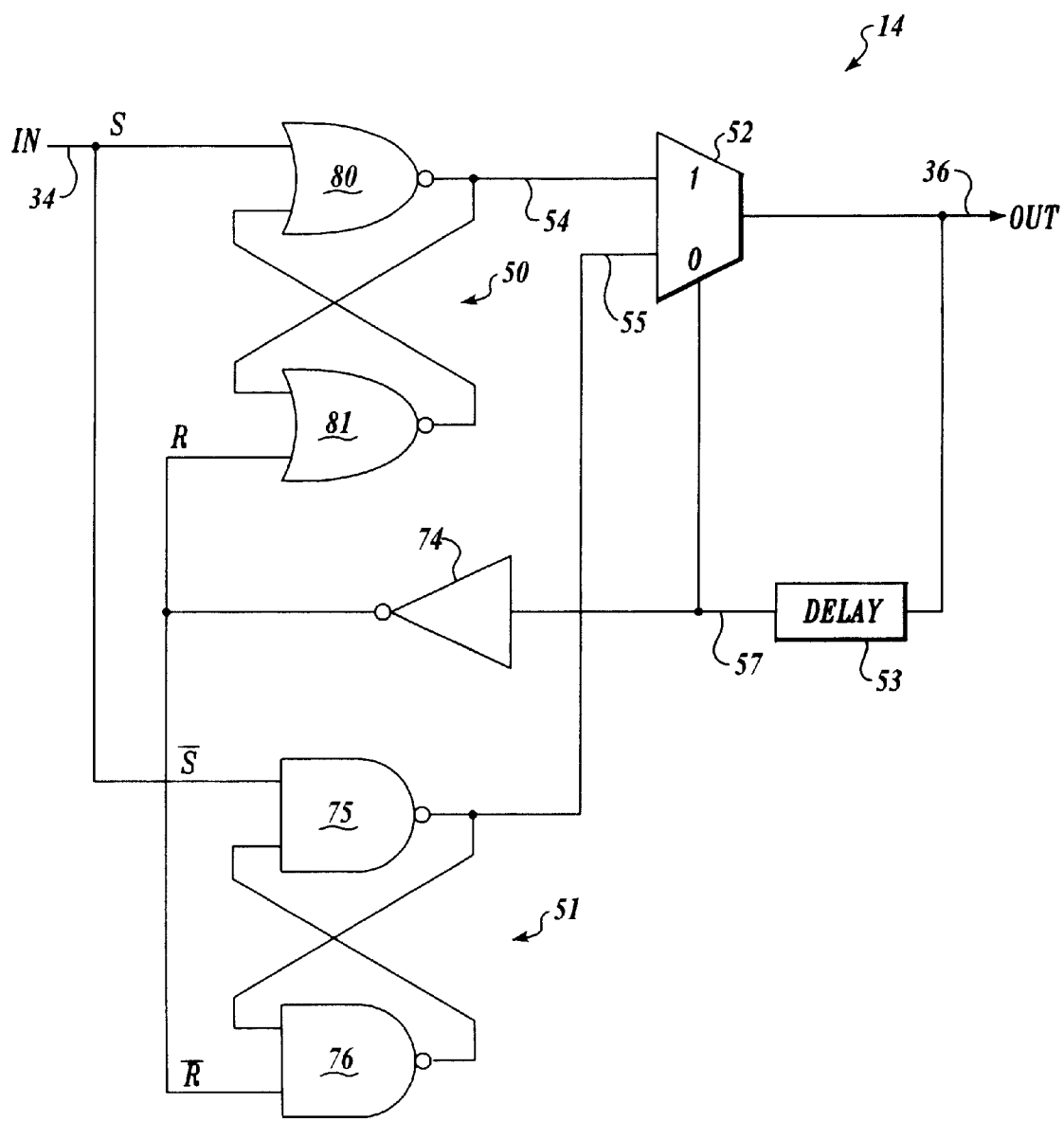
FIG. 8 is a schematic diagram illustrating implementations of the RS latches depicted in FIG. 5, according to another embodiment of the present invention.

FIG. 8 schematically illustrates another implementation of the RS latches of input circuit 14, according to the present invention. RS latch 51 is implemented as described above in conjunction with FIG. 7; however, in this embodiment, RS latch 50 is implemented using NOR gates 80 and 81. This implementation of RS latch 50 is a standard NOR gate circuit (see e.g., "Electronic Devices and Circuits: Discrete and Integrated", M. S. Ghausi, 1985, pages 638–639), with the complementing of its R terminal being performed inverter 74.

Figure 9:
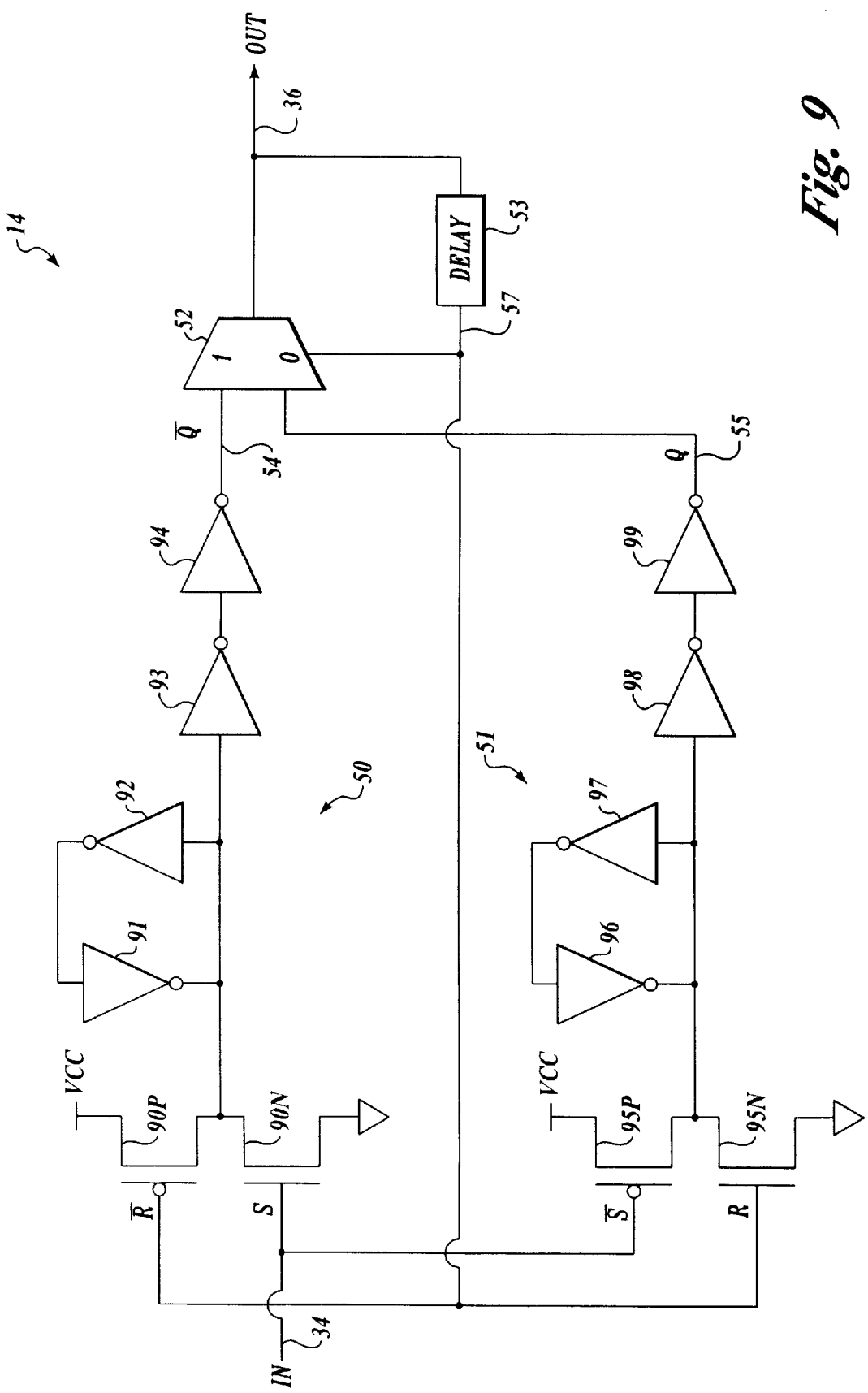
FIG. 9 is a schematic diagram illustrating implementations of the RS latches depicted in FIG. 5, according to yet another embodiment of the present invention.

FIG. 9 schematically illustrates yet another implementation of the RS latches of input circuit 14, according to the present invention. In this embodiment, RS latch 50 is implemented with P-channel transistor 90P, N-channel transistor 90N and inverters 91–94. RS latch 51 includes P-channel transistor 95P, N-channel transistor 95N and inverters 96–99.

The elements of RS latch 50 are interconnected as follows. P-channel transistor 90P has its source, gate and drain respectively connected to the VCC bus, delay circuit 53 via line 57, and the drain of N-channel transistor 90N. The gate of P-channel transistor 90P serves as the complemented R terminal for RS latch 50. The source and gate of N-channel transistor 90N are respectively connected to the ground bus and line 34 (to receive input signal IN). The gate of N-channel transistor 90N serves as the S terminal of RS latch 50. The drain of N-channel transistor 90N is also connected to the output lead of inverter 91 and to the input leads of inverters 92 and 93. The output lead of inverter 92 is connected to the input lead of inverter 91. Inverters 91 and 92 form a standard latch. The output lead of inverter 93 is connected to the input lead of inverter 94, which outputs the Qbar signal of RS latch 50 onto line 54.

The elements of RS latch 51 are interconnected as follows. P-channel transistor 95P has its source, gate and drain respectively connected to the VCC bus, line 34 (to receive input signal IN), and the drain of N-channel transistor 95N. The gate of P-channel transistor 95 serves as the complemented S terminal for RS latch 51. The source and gate of N-channel transistor 95N are respectively connected to the ground bus and delay circuit 53 via line 57. The gate of N-channel transistor 95N serves as the R terminal of RS latch 51. The drain of N-channel transistor 95N is also connected to the output lead of inverter 96 and to the input leads of inverters 97 and 98. The output lead of inverter 97 is connected to the input lead of inverter 96. Inverters 96 and 97 form a standard latch. The output lead of inverter 98 is connected to the input lead of inverter 99, which outputs the Q signal of RS latch 51 onto line 55.

RS latch 50 operates as follows. When R=S=0, transistors 90P and 90N are both turned off, thereby allows the latch formed by inverters 91 and 92 to maintain the current output signal. When R=1 and S=0 (i.e., reset), P-channel transistor 90P is turned on (due to the complementing at the R terminal), while N-channel transistor 90N is off. Thus, P-channel transistor 90P pulls up the voltage at the input lead of inverter 93, which then outputs a logic low signal. Inverter 94 then outputs a logic high signal onto line 54. Accordingly, RS latch 50 outputs a logic high Qbar signal during the reset state. Conversely, when R=0 and S=1 (i.e., set), transistors 90P and 90N are turned off and on, respectively. Thus, N-channel transistor 90N pulls down the voltage at the input lead of inverter 93, which then outputs a logic high signal. Inverter 94 then outputs a logic low level onto line 54. Accordingly, RS latch 50 outputs a logic low Qbar signal during the set state. When R=S=1, transistors 90P and 90N are both turned on; however, since the output signal of RS latch 50 is not used during this state, the ambiguity can be tolerated.

RS latch 51 operates as follows. When R=S=0, transistors 95P and 95N are both turned off, thereby allows the latch formed by inverters 96 and 97 to maintain the current output signal. When R=0 and S=1 (i.e., set), P-channel transistor 95P is turned on (due to the complementing at the S terminal), while N-channel transistor 95N is off. Thus, P-channel transistor 95P pulls up the voltage at the input lead of inverter 98, which then outputs a logic low signal, which in turn is inverted by inverter 99. Accordingly, RS latch 51 outputs a logic high Q signal during the set state. Conversely, when R=1 and S=0 (i.e., reset), transistors 95P and 95N are turned off and on, respectively. Thus, N-channel transistor 95N pulls down the voltage at the input lead of inverter 98, which outputs a logic high signal, which in turn is inverted by inverter 99. Accordingly, RS latch 51 outputs a logic low Q signal during the reset state. When R=S=1, transistors 95N and 95P are both turned on; however, since the output signal of RS latch 51 is not used during this state, the ambiguity can be tolerated.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A circuit, comprising:
   a first RS latch having a S terminal and a R terminal, the first RS latch to receive an input signal at its S terminal circuit;
   a second RS latch having a S terminal and a R terminal, the second RS latch to receive a complement of the input signal at its S terminal;
   a multiplexer, coupled to the first and second RS latches, to select an output signal from output signals from the first and second RS latches; and
   a delay circuit, coupled to the multiplexer and the first and second RS latches, to receive the output signal selected by the multiplexer and to provide a delayed version of the selected output signal to the second RS latch at its R terminal.

2. The circuit of claim 1, wherein the first RS latch is coupled to receive at its R terminal a complement of the signal received at the R terminal of the second RS latch.

3. The circuit of claim 1, wherein the first RS latch comprises a pair of cross-coupled NAND gates.

4. The circuit of claim 1, wherein the first RS latch comprises a pair of cross-coupled NOR gates.

5. The circuit of claim 1, wherein the first RS latch comprises:
   a first P-channel transistor having a gate coupled to the delay circuit;
   a first N-channel transistor having a gate coupled to receive the input signal, the first N-channel transistor having a drain coupled to a drain of the first P-channel transistor;
   a latch coupled to the drains of the first P-channel and first N-channel transistors; and
   an inverter coupled to the drains of the first P-channel and first N-channel transistors.

6. The circuit of claim 5, wherein the second RS latch comprises:
   a second N-channel transistor having a gate coupled to the delay circuit;
   a second P-channel transistor having a gate coupled to receive the input signal, the second P-channel transistor having a drain coupled to a drain of the second N-channel transistor;
   a latch coupled to the drains of the second P-channel and the second N-channel transistors; and
   an inverter coupled to the drains of the second P-channel and the second N-channel transistors.

7. A circuit, comprising:
   latching means for detecting a transition of the input signal and to generate a corresponding transition of an output signal; and
   time blanking means, coupled to the latching means, for preventing any subsequent transition of the output signal for a predetermined period that begins with essentially no delay from the corresponding transition of the output signal.

8. The circuit of claim 7, wherein the latching means comprises a first RS latch and a second RS latch, the first RS latch to receive the input signal at its S terminal, and the second RS latch to receive a complement of the input signal at its S terminal.

9. The circuit of claim 8, wherein the time blanking means comprises a delay circuit having an input lead coupled to receive the output signal and having an output lead coupled to an input lead of the latching means.

10. The circuit of claim 9, wherein the predetermined period is at least in part determined by the delay circuit.

11. The circuit of claim 9, wherein the time blanking means further comprises a multiplexer having input leads coupled to output leads of the first and second RS latches and having a control lead coupled to the output lead of the delay circuit.

12. The circuit of claim 11, wherein the multiplexer is coupled to a non-inverting output lead of one RS latch of the first and second RS latches and to an inverting output lead of the other RS latch of the first and second RS latches.

13. A circuit, comprising:
   a first RS latch circuit having a first input lead, a second input lead and an output lead, the first input lead of the first RS latch circuit to receive an input signal;

a second RS latch circuit having a first input lead, a second input lead and an output lead, the first input lead of the second RS latch circuit to receive the input signal; a multiplexer having a first input lead, a second input lead, a control lead and an output lead, the first and second input leads of the multiplexer being respectively coupled to the output leads of the first and second RS latch circuits; and a delay circuit having an input lead coupled to the output lead of the multiplexer and having an output lead coupled to the second input leads of the first and second RS latch circuits, the delay circuit to provide a delayed version of a signal received via the output lead of the multiplexer.

14. The circuit of claim 13, wherein the delay circuit is used in defining a predetermined time blanking period, the time blanking period beginning with essentially no delay from a transition of an output signal of the input circuit and during which no subsequent transition of the output signal can occur.

15. The circuit of claim 13, wherein the output lead, the first input lead and the second input lead of the first RS latch circuit respectively serve as a complemented Q terminal, a S terminal and a complemented R terminal of the first RS latch circuit.

16. The circuit of claim 13, wherein the output lead, the first input lead and the second input lead of the second RS latch circuit respectively serve as a Q terminal, a complemented S terminal and a R terminal of the second RS latch circuit.

17. A method, comprising:

monitoring an input signal;

detecting a transition of the input signal;

causing a transition of an output signal in response to the transition of the input signal; and preventing any transitions of the output signal during a time blanking period that begins with essentially no delay from the transition of the output signal.

18. The method of claim 17, further comprising allowing a transition of the output signal after the time blanking period expires.

19. The method of claim 17, wherein the time blanking period is greater than a rise/fall time of the input signal.

20. The method of claim 17, wherein two RS latches are used to monitor the input signal.

21. An apparatus, comprising:

means for monitoring an input signal;

means for detecting a transition of the input signal;

means for causing a transition of an output signal in response to the transition of the input signal; and means for preventing any transitions of the output signal during a time blanking period that begins with essentially no delay from the transition of the output signal.

22. The apparatus of claim 21, further comprising means for allowing a transition of the output signal after the time blanking period expires.

23. The apparatus of claim 21, wherein the time blanking period is greater than a rise/fall time of the input signal.

24. The apparatus of claim 21, wherein the means for monitoring comprises two RS latches.

25. The apparatus of claim 24, wherein the means for preventing comprises a delay circuit.

26. The apparatus of claim 25 further comprising a multiplexer coupled to the delay circuit and the two RS latches, the multiplexer forming part of the means for monitoring and the means for preventing.

27. A processor, comprising:

an input circuit to generate an output signal as a function of an input signal, the input circuit comprising:

a first RS latch circuit having a first input lead, a second input lead and an output lead, the first input lead of the first RS latch circuit to receive the input signal;

a second RS latch circuit having a first input lead, a second input lead and an output lead, the first input lead of the second RS latch circuit to receive the input signal;

a multiplexer having a first input lead, a second input lead, and an output lead, the first and second input leads of the multiplexer being respectively coupled to the output leads of the first and second RS latch circuits; and a delay circuit having an input lead coupled to the output lead of the multiplexer and having an output lead coupled to the second input leads of the first and second RS latch circuits and to a control lead of the multiplexer, the delay circuit to provide a delayed version of a signal received via the output lead of the multiplexer.

28. The processor of claim 27, wherein the delay circuit is used in defining a predetermined time blanking period, the time blanking period beginning with essentially no delay from a transition of an output signal of the input circuit and during which no subsequent transition of the output signal can occur.

29. The processor of claim 27, wherein the output lead, the first input lead and the second input lead of the first RS latch circuit respectively serve as a complemented Q terminal, a S terminal and a complemented R terminal of the first RS latch circuit.

30. The processor of claim 27, wherein the output lead, the first input lead and the second input lead of the second RS latch circuit respectively serve as a Q terminal, a complemented S terminal, and a R terminal of the second RS latch circuit.

* * * * *